United States Patent [19]

Mekata et al.

[11] Patent Number: 4,906,946

[45] Date of Patent: Mar. 6, 1990

[54] MICROWAVE OSCILLATOR HAVING SERIES AND PARALLEL FEEDBACK

[75] Inventors: Tsuyoshi Mekata, Neyagawa; Hiroshi Saka, Katano; Toshihide Tanaka, Ikoma, all of Japan

[73] Assignee: Matsushita Electric Industrial Co., Ltd., Osaka, Japan

[21] Appl. No.: 248,904

[22] Filed: Sep. 23, 1988

[30] Foreign Application Priority Data

Sep. 25, 1987 [JP] Japan ................................. 62-241274

[51] Int. Cl.⁴ ................................................ H03B 5/18
[52] U.S. Cl. ................................. 331/99; 331/117 D; 331/117 FE
[58] Field of Search ............. 331/96, 99, 101, 117 FE, 331/117 D

[56] References Cited

U.S. PATENT DOCUMENTS 4,435,688 3/1984 Shinkawa et al. .......... 331/117 D X
4,707,669 11/1987 Mekata et al. .............. 331/117 D X

FOREIGN PATENT DOCUMENTS 62-29207 2/1987 Japan .
62-56004 3/1987 Japan .
62-135002 6/1987 Japan .

Primary Examiner—Siegfried H. Grimm
Attorney, Agent, or Firm—Wenderoth, Lind & Ponack

[57] ABSTRACT

A feedback type microwave oscillator using a three-terminal active element employs both series feedback and parallel feedback and capacitance in its output circuit, thereby increasing the small signal negative resistance, and the output power and its resistance to impedance fluctuations of a load attached thereto.

14 Claims, 16 Drawing Sheets

Inductance of Inductor 35

|  |  | ① | ② | ③ | ④ | ⑤ |
|---|---|---|---|---|---|---|
| Element Value | $C_1$ (pF) | 0 | 0.1 | 0.2 | 0.3 | 0.4 |
|  | L (nH) | 1.5 | 1.2 | 0.8 | 0.6 | 0.5 |
| Characteristic | $|\Gamma_G|$ (dB) | 1.8 | 7.4 | 9.1 | 8.2 | 6.8 |
|  | Gain (dB) (1) | −4.1 | 5.4 | 8.4 | 7.6 | 6.0 |
|  | Load Clearance VSWR (2) | 1.9 | 8.4 | 13.8 | 17.0 | 13.3 |

(1) Gain between gate and output terminal.

MICROWAVE OSCILLATOR HAVING SERIES AND PARALLEL FEEDBACK

BACKGROUND OF THE INVENTION

This invention relates to a microwave oscillator using an active element for oscillation having three terminals.

Two types of conventional microwave oscillators are known, namely a series feedback type oscillator circuit and a parallel feedback type oscillator circuit as disclosed in Japanese Patent Publication No. Sho. 60-47764.

FIG. 1 shows an equivalent circuit of a prior art series feedback type oscillator circuit with drain grounding in which element 1a is a field effect transistor (FET) element; element 2a is a gate terminal; element 3a is a drain terminal, and element 4a is a source terminal. Reference number 5a denotes a series feedback circuit composed of capacitive or inductive elements 6a and 7a; elements 6a and 7a are selected so that one is capacitive and the other inductive, or vice versa. The source terminal 4a is connected to a load 8a, and the other ends of the elements 6a, 7a, and 8a are commonly connected.

FIG. 2 shows a practical example of the conventional microwave oscillator described above. Elements in FIG. 2 which are the same as those shown in FIG. 1 are identified with same reference numbers. That is, element 1a is a FET; element 2a is a gate terminal, 3a is a drain terminal, and element 4a is a source terminal. Reference number 9a denotes a microstripline, one end of which is terminated at the gate terminal 2a and the other end at a terminal resistor 10a. Reference number 11a denotes a dielectric resonator, which is a disposed so as to be coupled to the microstripline 9a. Reference number 12a denotes a power source terminal, and element 13a is a ¼ wavelength open-ended microstripline having a length of about ¼ wavelength at the oscillation frequency. Reference number 14a denotes a self-bias resistor, and element 15a is a low pass filter. Reference number 16a denotes an output terminal.

In a conventional microwave oscillator as described above, the reactance caused due to a deviation of the line length of the ¼ wavelength microstripline 13a from the accurate ¼ wavelength corresponds to the element 6a in FIG. 1, and the resonant circuit composed of the dielectric resonator 11a and microstripline 9a corresponds to the element 7a in FIG. 1, so that the circuit in FIG. 2 is a series feedback oscillator circuit. In FIG. 2, when a direct-current power source is supplied from the power source terminal 12a, the potential at the gate terminal 2a becomes lower than the potential at the source terminal 4a due to the voltage drop by the current flowing in the self-bias resistor 14a. At this time, when the ¼ wavelength open-ended microstripline 13a is connected to the drain terminal 3a, a negative resistance is generated at the gate terminal 2a, and the reflectivity as seeing the FET 1a side from the gate terminal 2a $\Gamma_G$ becomes $|\Gamma_G| > 1$. Assuming the reflectivity in the vicinity of the resonant frequency of the dielectric resonator 11a as seeing the microstripline 9a side from the gate terminal 2a to be $\Gamma_R$, if $$|\Gamma_R| \cdot |\Gamma_G| \geq 1 \tag{1}$$

then repetitive reflection occurs between the gate terminal 2a and the microstripline 9a, and oscillation is initiated. Its output is obtained from the source terminal.

FIG. 3 shows an equivalent circuit of a conventional source-grounded parallel feedback oscillator circuit. Elements which are the same as those shown in FIG. 1 and FIG. 2 are identified with same reference numbers. That is, element 1a is a FET; element 2a is a gate terminal, 3a is a drain terminal, and element 4a is a source terminal. Reference number 17a denotes a parallel feedback circuit composed of capacitive or inductive elements 18a, and 19a; elements 18a and 19a are selected so that one is capacitive and the other inductive, or vice versa. The element 18a is connected between the gate terminal 2a and source terminal 4a of the FET 1a; the element 19a is connected between the gate terminal 2a and the drain terminal 3a of the FET 1a, and a load admittance element 20a is connected to the drain terminal 3a of the FET 1a.

FIG. 4 shows an equivalent circuit of a practical structure of parallel feedback type oscillator, in which element 1a is a FET; element 2a is a gate terminal; element 3a is a drain terminal, and element 4a is a source terminal. Reference numbers 21a and 22a denote open-ended microstriplines, which are electromagnetically coupled to a dielectric resonator 23a. Reference number 24a denotes an output terminal connected to the drain terminal. In the circuit shown in FIG. 4, in the vicinity of the resonant frequency of the dielectric resonator 23a, a positive feedback is applied from the drain terminal 3a to the gate terminal 2a by way of the microstriplines 21a and 22a, and the dielectric resonator 23a. Assuming the gain of this feedback route to be $G_R$ ($|G_R| < 1$), and the gain between the gate terminal 2a and source terminal 3a of the FET 1a to be $G_F$, if $$|G_R| \cdot |G_F| \geq 1 \tag{2}$$

then the circuit in FIG. 4 starts oscillation in the vicinity of the resonant frequency of the dielectric resonator 23a, and its output is obtained from the output terminal 24a.

In the constitution as shown in FIG. 1 then however, if the gain of the FET 1a is low or the gate-source capacity in the FET 1a is large, then the absolute value of reflectivity $|\Gamma_G|$ as seeing the FET 1a side from the gate terminal 2a is low, and the start of oscillation is not secure.

Yet, in the drain-grounded oscillator as shown in FIG. 2, if the FET 1a is a chip or if the entire circuit is fabricated in a monolithic integrated circuit, then the floating capacity which exists in the package FET does not exist, and the FET characteristic changes, and the negative resistance generated at the gate terminal decreases, and the stability of oscillation is lowered.

Or, in the circuit of FIG. 3, if the absolute gain $|G_F|$ of the FET 1a is low, or if the absolute gain $|G_R|$ of the feedback route feeding back to the gate terminal 2a from the drain terminal 3a through the microstriplines 21a and 22a and the dielectric resonator 23a is low, then oscillation is not started or the output is lowered.

SUMMARY OF THE INVENTION

In the light of the above-discussed points, hence, it is a primary object of this invention to present a microwave oscillator which oscillates stably if the gain of the active element for oscillation is somewhat low or if the internal capacity is large.

To achieve the above object this invention presents a microwave oscillator which comprises; a three-terminal active element having first, second and third terminals; a first inductive element having one end grounded at high frequency and having another end connected to the first terminal; a resonant circuit connected to the second terminal, and a first capacitive element having one end connected to the first terminal and having another end connected to the third terminal, wherein an output is provided at the third terminal.

While the novel features of the invention are set forth in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
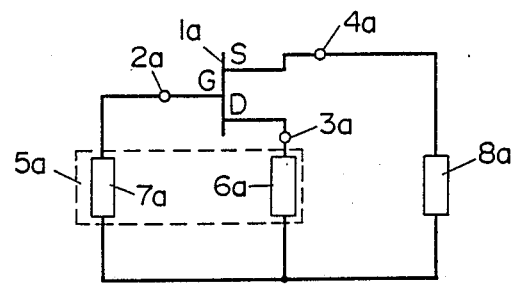
FIG. 1 is an equivalent circuit diagram of a conventional microwave oscillator.
Figure 2:
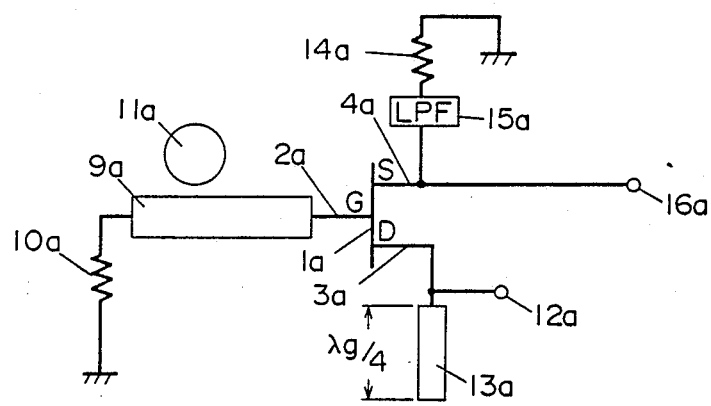
FIG. 2 is a circuit structural drawing of a conventional microwave oscillator.

Referring now to the drawings, some of the embodiments of this invention are described in details below.

Figure 5:
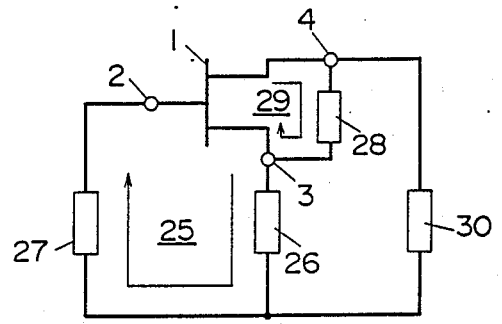
FIG. 5 is an equivalent circuit diagram of a microwave oscillator in accordance with a first embodiment of this invention.

FIG. 5 shows a high frequency equivalent circuit diagram of a microwave oscillator in accordance with one of the embodiments of this invention.

Figure 3:
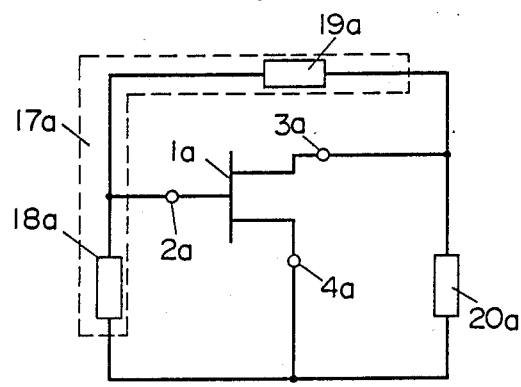
FIG. 3 is an equivalent circuit diagram of a conventional microwave oscillator.
Figure 4:
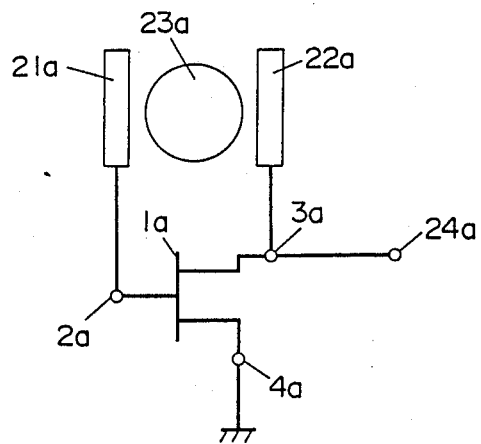
FIG. 4 is a circuit structural drawing of a conventional microwave oscillator.

In FIG. 5, reference number 1 denotes an FET; element 2 is a gate terminal; element 3 is a drain terminal, and element 4 is a source terminal. Reference number 25 denotes series feedback circuit, which is composed of an inductive element 26 and a capacitive element 27. Reference number 28 is another capacitive element, having one end connected to the source terminal 4 and having another end connected to the drain terminal 3, thereby forming a parallel feedback circuit 29. The source terminal 4 is connected to a load impedance element 30, and the other ends of the elements 26, 27, 30 are commonly connected. As evident by comparing FIG. 5 with FIG. 1 and FIG. 3, this is neither the conventional series feedback type oscillator circuit nor the parallel feedback type oscillator circuit, but it is a series-parallel feedback type oscillator circuit.

Figure 6:
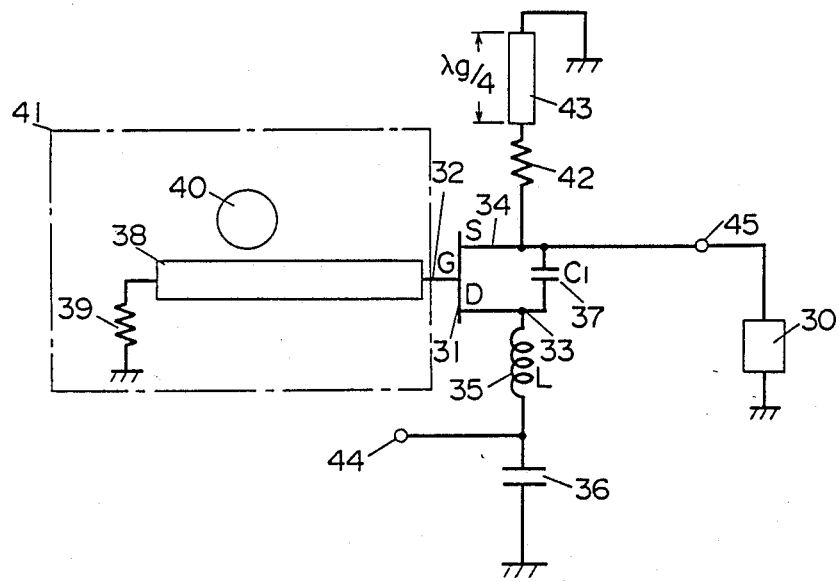
FIG. 6 is a circuit structural drawing of a microwave oscillator in accordance with the first embodiment of this invention.

FIG. 6 shows an example of practical structure of the microwave oscillator of the first embodiment, in which element 30 is a load, and element 31 is a FET having the following S-parameters at 10.75 GHz.

TABLE 9

| | S-parameter of chip FET | | | |
|---|---|---|---|---|
| | $S_{11}$ | $S_{21}$ | $S_{12}$ | $S_{22}$ |
| MAG | 0.71 | 1.58 | 0.09 | 0.495 |
| ANG | −132 | 78 | 45 | −34 |

$f_0 = 10.75$ GHz

Reference number 32 denotes a gate terminal; element 33 is a drain terminal, and element 34 is a source terminal. Reference number 35 denotes an inductor, which corresponds to the element 26 in FIG. 5, having one end connected to ground at high frequency by way of a bypass capacitor 36, and having another end connected to the drain terminal 33. Reference number 37 denotes a capacitor having one end connected to the source terminal 34 and having another end to the drain terminal 33. Reference number 38 denotes a microstripline having one end terminated at a terminal resistor 39, and having another end connected to the gate terminal 32. Reference number 40 denotes a dielectric resonator which is disposed so as to be electromagnetically coupled to the microstripline 38. A resonant circuit is composed of the microstripline 38, terminal resistor 39, and dielectric resonator 40, and the impedance in the vicinity of the resonant frequency of this resonant circuit corresponds to the impedance of the element 27 in FIG. 5. Reference number 42 denotes a self-bias resistor, and element 43 denotes a ¼ wavelength microstripline having a length of ¼ of the wavelength at the oscillation frequency. Reference number 44 denotes a bias terminal, and element 45 is an output terminal.

The operation of the microwave oscillator of the embodiment show in FIG. 6 is as follows.

The ¼ wavelength microstripline 43, which is grounded at one end, is open at the oscillation frequency at the other end, and passes only direct-current bias current, thereby preventing the output signal from being consumed in the self-bias resistor 42. The inductor 35 and capacitor 37, having their inductance and capacitance set properly, act to increase the absolute value of the reflectivity $|P_G|$ seen from the gate terminal 32 of the FET 31 to the FET 31 side. Assuming the absolute value of the reflectivity in the vicinity of the resonant frequency of the dielectric resonator 40 in the resonant circuit 41 to be $|\Gamma|$, if $$|\Gamma_r|\cdot|\Gamma_G| \gtrsim 1 \qquad (3)$$

then only the signal in the vicinity of the resonant frequency of the dielectric resonator 40 is repetitively reflected between the gate terminal 32 and resonant circuit 41, and oscillation is started.

Figures 7A, 7B:
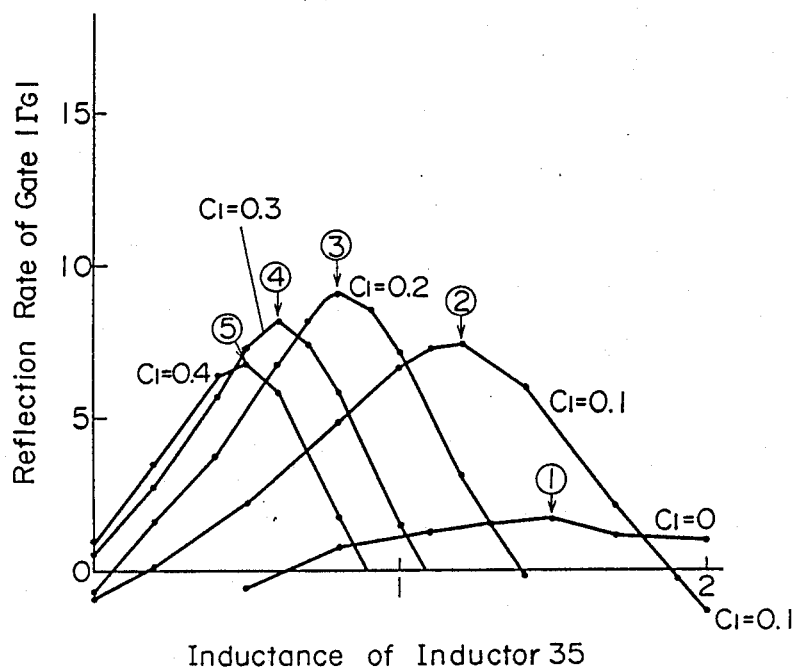
FIGS. 7(a)–7(b) together form a characteristic diagram showing the effects of the first embodiment in accordance with this invention.

FIG. 7(a) shows the relationship between the reflectivity $|\Gamma_G|$ at the oscillation frequency 10.75 GHz as seen from the gate terminal 32 to the FET 31 side and the inductance L of the inductor 35, as calculated on a certain chip FET in terms of capacitance C of the capacitor 37. FIG. 7(b) shows the characteristics at points 1, 2, 3, 4, 5 in FIG. 7(a). In the case of FIG. 7(a), when the drain terminal 33 is grounded by way of the inductor 2 of 0.8 nH to set the capacitance $C_1$ of the capacitor 37 to 0.2 pF (at this time, the relationship of $$10.75 \text{ GHz} \simeq \frac{1}{2\pi\sqrt{LC}}$$

is established), rather than when it is directly grounded at high frequency (equivalent to L=0), the absolute value of the reflectivity $|\Gamma_G|$ as seen from the gate terminal 32 to the FET side can be set higher, so that the oscillation condition in formula (3) may be satisfied even if the reflectivity $|P_R|$ of the resonant circuit is low. Therefore, it is possible to obtain a microwave oscillator which can start oscillation securely even if $|P_R|$ is low. Meanwhile, the oscillation signal generated between the dielectric resonator 40 and the gate terminal 30 is amplified by the gain shown in FIG. 7(b), and is out put from the output terminal. During oscillation, the FET works on a large signal. Accordingly, the output power of the FET is saturated, and the signal is not amplified exactly according to the gain in FIG. 7(b), but the oscillation output is higher when the gain is higher. Hence the oscillation output is higher when capacitance $C_1=0.2$ pF, rather than when $C_1=0$ pF as in the prior art. Incidentally, the maximum VSWR of the load becoming $|\Gamma G| > 1$ in all phases is largest when $C_1=0.2$ to 0.3 pF, and the oscillation is maintained if the impedance of the load 30 changes significantly. What is more, by setting the capacitor 37 at a proper capacitance, the inductance of the inductor 35 may be reduced, and the size of the oscillator may be hence reduced.

Thus, according to this embodiment, in the microwave oscillator, by grounding the drain terminal 33 of the FET 31 by way of the inductor 35 having a proper value, and connecting the drain terminal 33 and source terminal 34 of the FET 31 to the capacitor 37 having a proper value, it is possible to obtain a microwave oscillator which starts oscillation securely, and is high in the oscillation output power and is resistant to the impedance fluctuations of the load 30. Still more, since the inductance of the inductor 35 can be decreased, it is suited to a reduction of size and optimized IC design.

Figure 8:
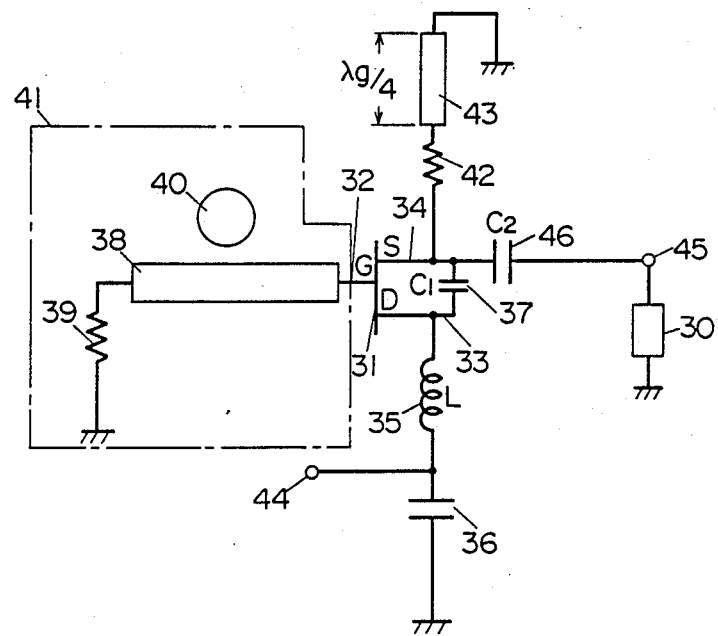
FIG. 8 is a circuit structural drawing of a microwave oscillator in accordance with a second embodiment of this invention.

FIG. 8 shows a microwave oscillator in accordance with a second embodiment of this invention. The elements which are the same as those shown in FIG. 6 are identified with the same reference numbers. The configuration is similar to that of FIG. 6, except that a capacitor 46 is inserted in series between a source terminal 34 and an output terminal 46.

The operation of the microwave oscillator shown in FIG. 8 is explained below.

In FIG. 8, the operation is exactly the same as in FIG. 6, except for the operation of the capacitor 46. That is, the capacitor 46 acts to increase the absolute value of reflectivity $|\Gamma G|$ as seen from the gate terminal 32 of the FET 31 to the FET 31 side at the oscillation frequency, more than in the case of the microwave oscillator shown in FIG. 6.

Figure 9:
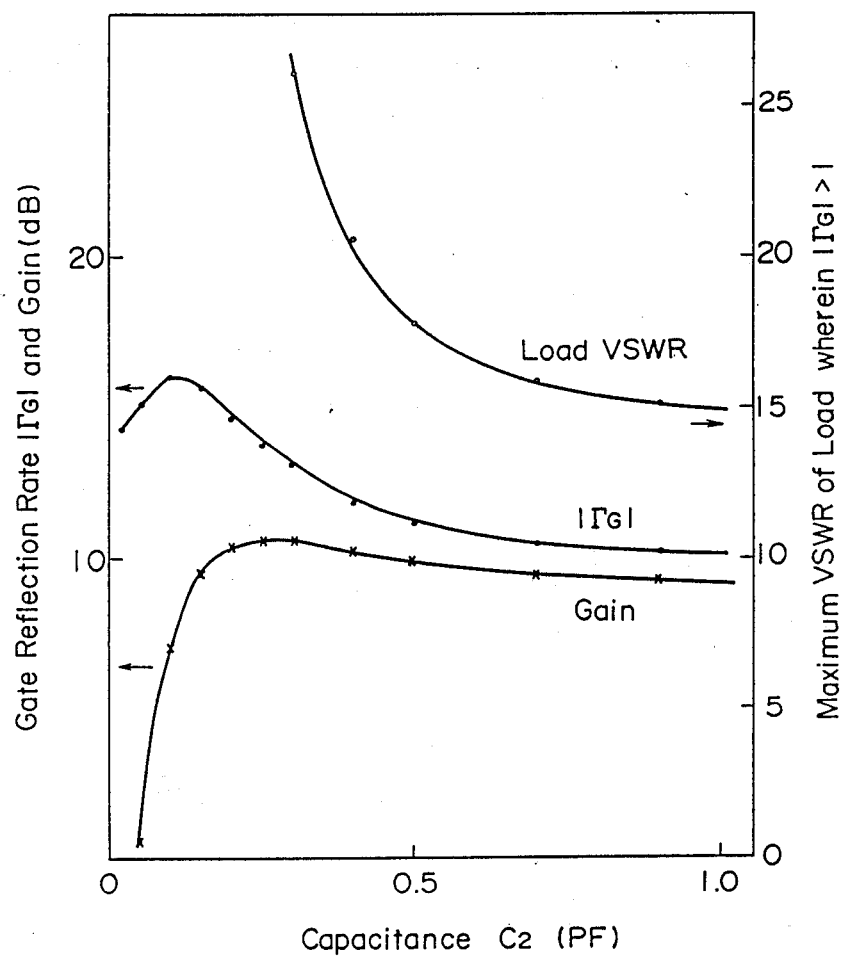
FIG. 9 is a characteristic diagram showing the effects of the second embodiment in accordance with this invention.

FIG. 9 shows the relationship among the capacitance $C_2$ of the capacitor 46, the absolute reflectivity $|\Gamma G|$ as seen from the gate terminal 32 to the FET side at oscillation frequency of 10.75 GHz, the gain between the gate terminal 32 and output terminal 45, and the maximum VSWR of the load 30 to establish the relationship of $|\Gamma_G|>1$, in the FET 31 having the same characteristics as in FIG. 6, setting the inductance L of the inductor 35 at 0.8 nH, and the capacitance $C_1$ of the capacitor 37 at 0.2 pH, in which when the capacitance $C_2$ of the capacitor 46 is 0.2 pF, all of the absolute reflectivity $|\Gamma G|$ as seen from the gate terminal 32 to the FET 31 side, the gain between gate terminal 32 and output terminal 45, and the maximum VSWR of the load 30 to set the relationship of $|\Gamma_G|>1$ are greater than in FIG. 6. It is therefore possible to obtain a microwave oscillator having an improved performance. Moreover, since the output terminal 45 and source terminal 34 are isolated in terms of DC by the capacitor 46, it is not necessary to insert an additional DC blocking capacitor into the output side.

Thus, according to the embodiment shown in FIG. 8, by inserting the capacitor 46 near the chip FET 31 in the microwave oscillator in FIG. 6 and between the source terminal 34 and output terminal 45, it is possible to obtain a microwave oscillator which starts oscillation more securely, and is larger in output power, and is capable of maintaining oscillation if the impedance of the load 30 fluctuates greatly.

Figure 10:
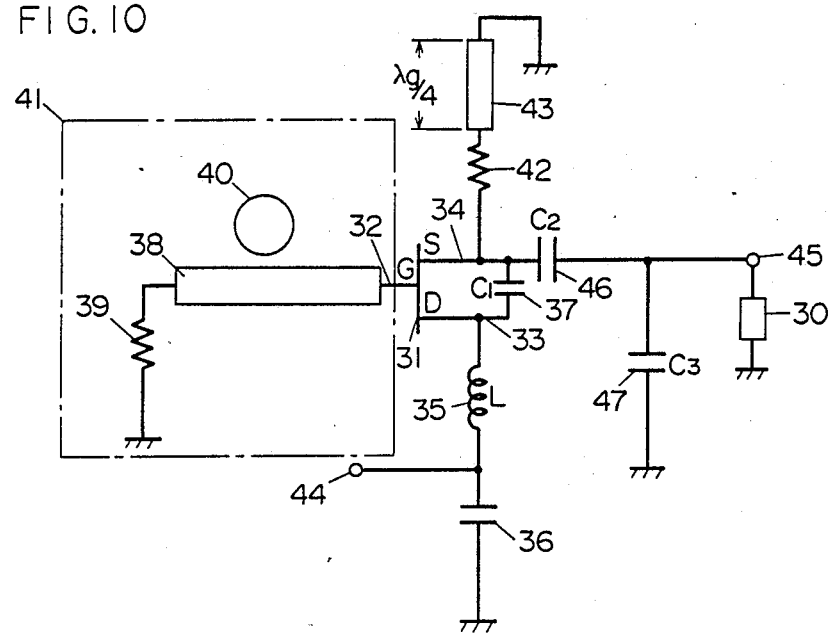
FIG. 10 is a circuit structural drawing of a microwave oscillator in accordance with a third embodiment of this invention.

FIG. 10 shows a microwave oscillator in accordance with a third embodiment of this invention. The elements which are the same as those shown in FIGS. 6 and 8 are identified with the same reference numbers. The configuration in FIG. 10 is similar to that shown in FIG. 8, except that a capacitor 47 is inserted between the output terminal 45 and ground.

Figure 11:
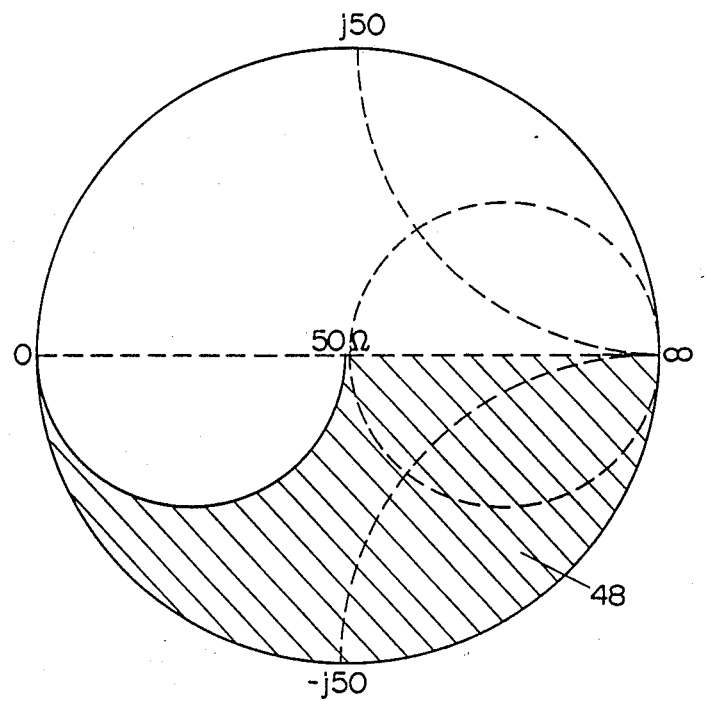
FIG. 11 is a characteristic diagram showing the effects of the third embodiment in accordance with this invention.

The operation of the microwave oscillator shown in FIG. 10 is described below. FIG. 11 is a Smith chart plotting of the impedance seen from the source terminal 34 to the load 30 side, assuming that the impedance of the load 30 is 50 Ω, in the embodiment shown in FIG. 10. The impedance seen from the source terminal 43 to the load side (except for capacitor 37) connected to the capacitors 46 and 47 and terminal 45 can be realized at all points in the shaded area 48 in FIG. 11 by varying the capacitance of the capacitors 46 and 47. It is hence easy to adjust the load impedance of the FET 31 to an optimum load impedance for large signal operation during oscillation. By optimizing the load impedance, it is possible to obtain a microwave oscillator having a high output power, or a microwave oscillator having a higher stability, i.e. not stopping oscillation if the load impedance changes significantly.

Thus, in the embodiment shown in FIG. 10, by properly setting the inductance and capacitance of the inductor 35, and capacitors 37, 46, 47, and it is possible to obtain a microwave oscillator which starts oscillation securely and has a high output power, or a microwave oscillator which is highly stable, not stopping oscillation if the load impedance fluctuates greatly.

Figure 12:
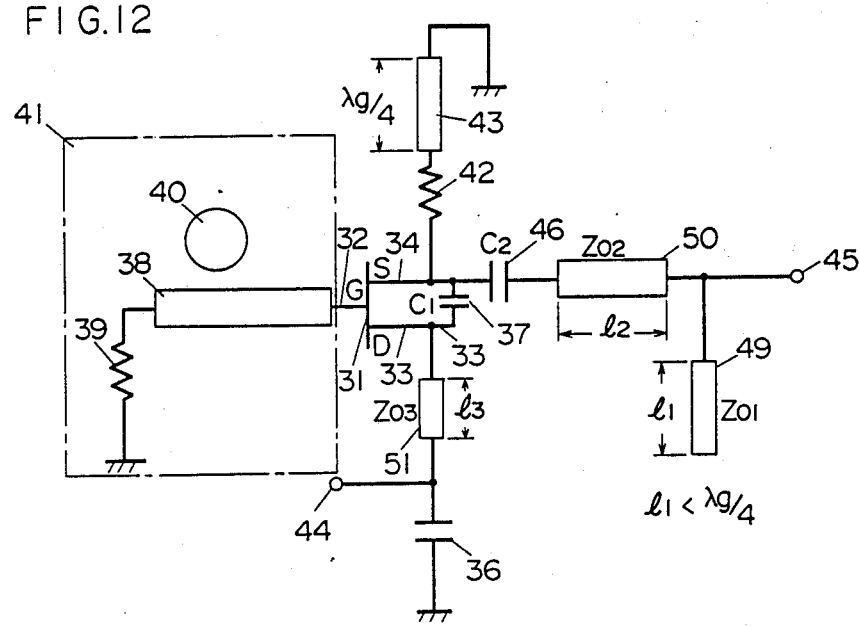
FIG. 12 is a circuit structural drawing of a microwave oscillator in accordance with a fourth embodiment of this invention.

FIG. 12 shows a microwave oscillator in accordance with a fourth embodiment of this invention. The elements which are the same as those shown in FIGS. 6, 8, and 10 are identified with the same reference numbers. That is, element 31 is a chip FET; element 32 is a gate terminal; element 33 is a drain terminal, and element 34 is a source terminal. Reference number 37 denotes a capacitor having one end connected to the drain terminal 33, and having another end connected to the source terminal 34. Reference number 38 denotes a microstripline having one end connected to the gate terminal 32 and having another end terminated by a terminal resistor 39. Reference number 40 denotes a dielectric resonator 40 which is electromagnetically coupled to the microstripline 38. Reference number 41 denotes a resonant circuit composed of the microstripline 38, the terminal resistor 39, and the dielectric resonator 40. Reference number 36 is a bypass capacitor, 42 denotes a self-bias resistor; element 43 is a ¼ wavelength microstripline having a length of ¼ of the wavelength at the oscillation frequency and having one end grounded and element 44 is a power source terminal. Moreover, element 45 is an output terminal; element 49 is a capacitive open-ended microstripline with a characteristic impedance of $Z_{01}$ and a length of $l_1$; element 50 is a microstripline with a characteristic impedance of $Z_{02}$ and a length of $l_2$, and element 51 is a microstripline with a characteristic impedance of $Z_{03}$ and a length of $l_3$.

The operation of the microwave oscillator shown in FIG. 12 is described below.

The ¼ wavelength microstripline 43, which is grounded at one end, is open at the oscillation frequency at the other end, and passes only DC bias current, and prevents the output signal from being consumed by the self-bias resistor 42. The microstripline 51 has an inductance equivalent to that of the inductor 35 in FIGS. 6, 8 and 10, by properly setting its characteristic impedance $Z_{03}$ and length $l_3$. The capacitors 37 and 46 further increase the absolute value of the reflectivity seen from the gate terminal 32 to the FET 31 side, in the same fashion as in the embodiment in FIGS. 6 and 8. Moreover, the capacitive open-ended microstripline 49 equivalently acts as a capacitor by setting its length shorter than ¼ of the wavelength at the oscillation frequency. Furthermore, by properly setting the characteristic impedances $Z_{01}$ and $Z_{02}$ and the lengths $l_1$ and $l_2$ of the microstriplines 49 and 50, the impedance seen from the source terminal 34 of the FET 31 to the load side can be set in a wider range than in the embodiment shown in FIG. 10.

Figure 13:
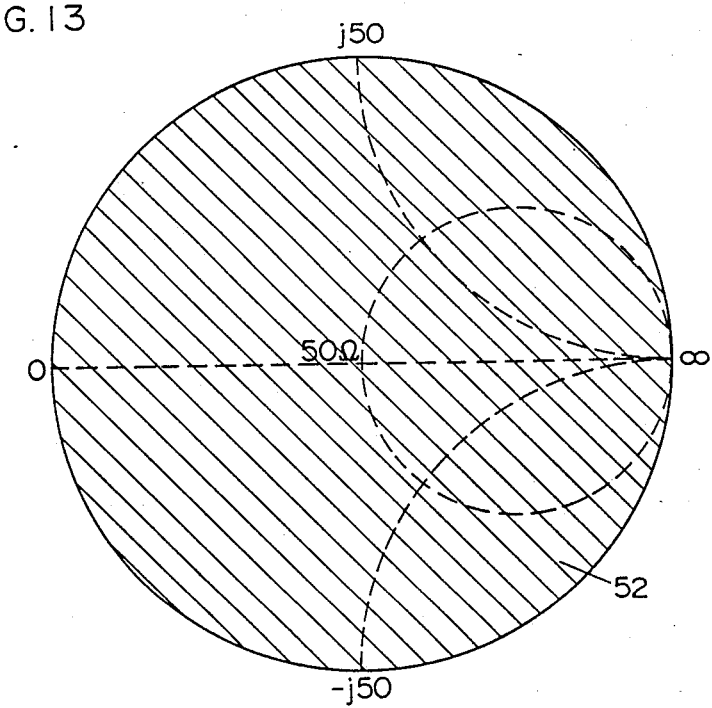
FIG. 13 is a characteristic diagram showing the effects of the fourth embodiment in accordance with this invention.

FIG. 13 is a Smith chart plotting of the impedance seen from the source terminal 34 of the FET 31 to the load side (excluding the capacitor 37), in the microwave oscillator in FIG. 12.

The impedance seen from the source terminal 34 to the load side can realize all points in the shaded area 52 in FIG. 13, by varying the capacitance of the capacitor 46, or the characteristic impedance $Z_{01}$, or the length $l_1$ of the microstripline 49, or the characteristic impedance $Z_{02}$, or the length $l_2$ of the microstripline 50. This area 52 is wider than the range 48 in FIG. 11 obviously. Therefore, in the embodiment in FIG. 12, since the setting range of the load impedance is wider than in the embodiment in FIG. 10, it is possible to obtain, more easily than in the embodiment in FIG. 10, a microwave oscillator which is superior in performance, having a higher in output power, and more resistant to load impedance fluctuations.

Thus, in the embodiment in FIG. 12, by properly setting the element values of capacitors 37 and 46, and dimensions of the microstriplines 49, 50 and 51, it is easy to obtain a microwave oscillator having a superior performance than in the embodiments shown in FIGS. 6, 8 and 10.

Figure 14:
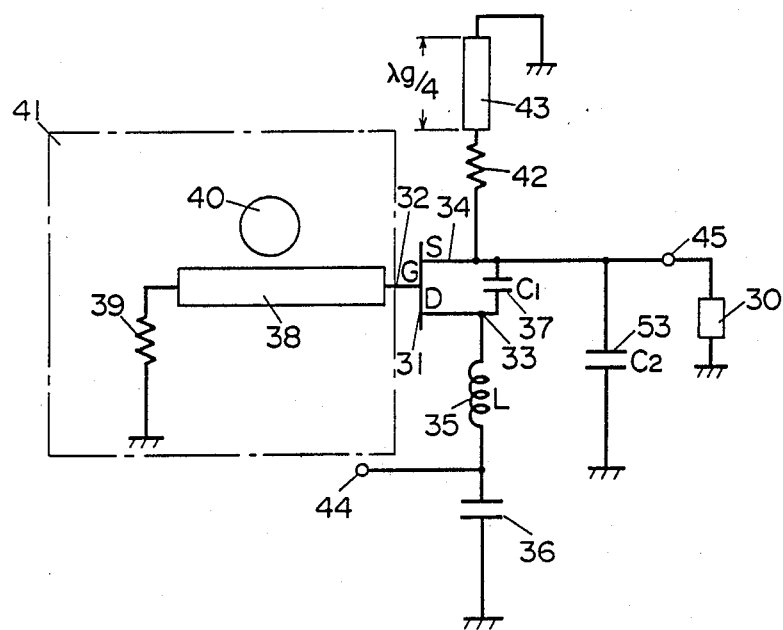
FIG. 14 is a circuit structural drawing of a microwave oscillator in accordance with a fifth embodiment of this invention.

FIG. 14 shows a fifth embodiment of microwave oscillator in accordance with this invention. The elements which are the same as those shown in FIGS. 6, 8, 10, and 12 are identified with the same reference numbers. The configuration is similar to that of FIG. 6, except that a capacitor 53 is inserted between a source terminal 34 and the ground.

The operation of the microwave oscillator shown in FIG. 14 is described below. In FIG. 14, the operation is exactly same as in FIG. 6, except for the operation of the capacitor 53. The capacitor 53 acts to increase the absolute reflectivity $|\Gamma_G|$ seen from the gate terminal 32 of the FET 31 to the FET 31 side at oscillation frequency, and the gain between the gate terminal 32 and output terminal 45, more than in the case of FIG. 6.

Figure 15:
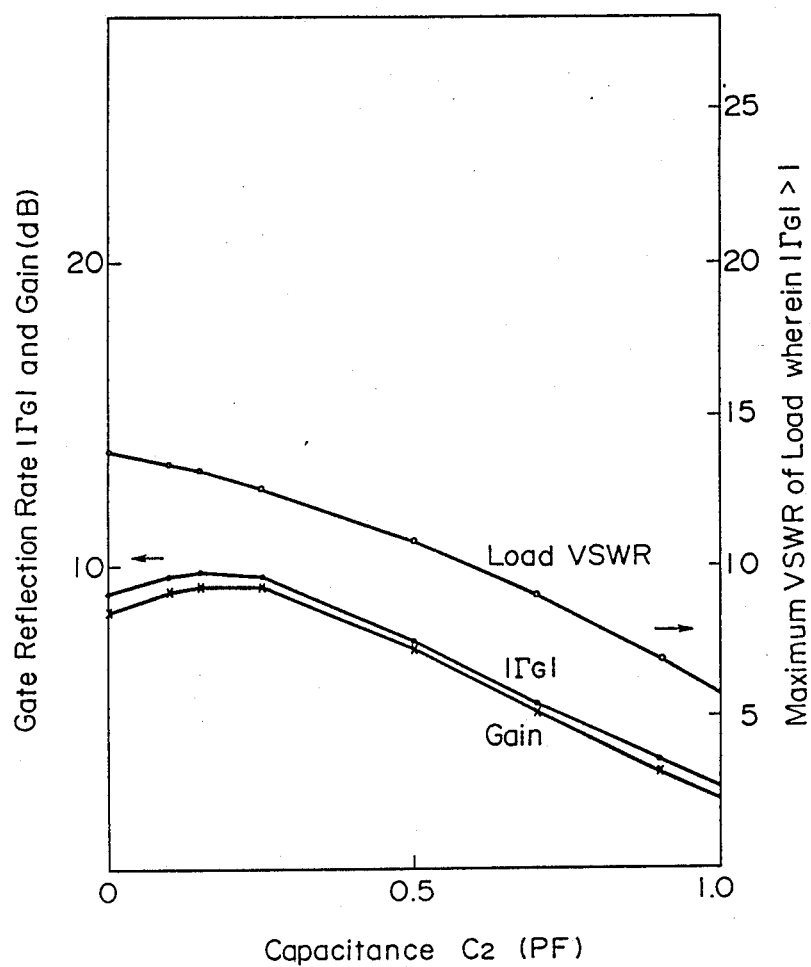
FIG. 15 is a characteristic diagram showing the effects of the fifth embodiment in accordance with this invention.

FIG. 15 shows the relationship among the capacitance $C_2$ of the capacitor 53, the absolute reflectivity $|\Gamma_G|$ seen from the gate terminal 32 to the FET 31 side at oscillation frequency of 10.75 GHz, the gain between gate terminal 32 and output terminal 45, and the maximum VSWR value of the load to keep the relationship of $|\Gamma_G| > 1$, concerning a certain chip FET, assuming that the inductance of the inductor 35 to be 0.8 nH and the capacitance $C_1$ of the capacitor 37 to be 0.2 pF. It is apparent from FIG. 15 that, when the capacitance $C_2$ of the capacitor 53 is 0.15 pF, the absolute reflectivity $|\Gamma_G|$ seen from the gate terminal 32 to the FET 31 side becomes a maximum, whereas the gain between the gate terminal 32 and the output terminal 45 also reaches a maximum. Hence, in the embodiment in FIG. 15, it is possible to form a microwave oscillator which starts oscillation more securely, and maintains the oscillation if the impedance of the load 30 varies significantly, as compared with the embodiment in FIG. 6 without the capacitor 53.

Thus, according to the embodiment shown in FIG. 14, by connecting the capacitor 53 having a proper capacitance to the microwave oscillator in FIG. 6 near the chip FET 31 with the end grounded to the source terminal 34, it is possible to obtain a microwave oscillator which starts oscillation more securely.

Figure 16:
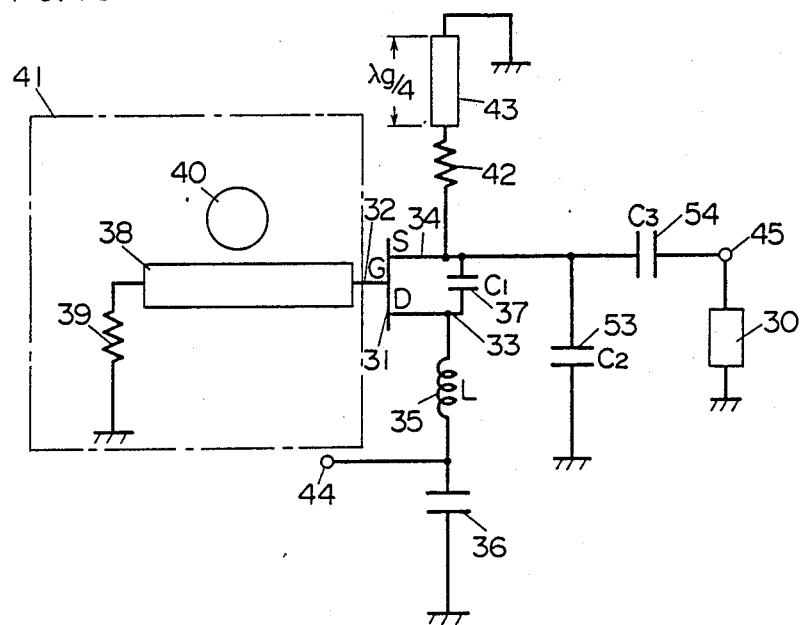
FIG. 16 is a circuit structural drawing of a microwave oscillator in accordance with a sixth embodiment of this invention.

FIG. 16 shows a sixth embodiment in accordance with this invention, showing a circuit structural drawing of a microwave oscillator. The elements which are the same as those in FIGS. 6, 8, 10, 12, and 14 are identified with the same reference numbers. The configuration is similar to that of FIG. 14, except that one end of a capacitor 54 is connected to the non-grounded terminal of the capacitor 53 while the output is obtained from the other end.

Figure 17:
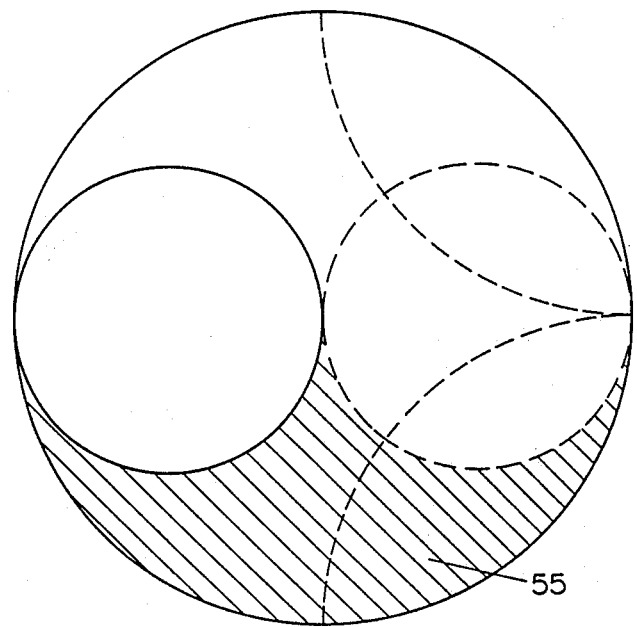
FIG. 17 is a characteristic diagram showing the effects of the sixth embodiment in accordance with this invention.

The operation of thus composed microwave oscillator embodied in FIG. 16 is described below. In the embodiment in FIG. 16, the load impedance of the microwave oscillator can be set in a wide range by means of capacitors 53 and 54. FIG. 17 is a Smith chart plotting of the impedance seen from the source terminal 34 to the load side (except for the capacitor 37), in the embodiment in FIG. 16.

The impedance seen from the source terminal 34 to the load side can realize all points in the shaded area 55 in FIG. 17 by varying the values of the capacitors 53 and 54. Accordingly, it is possible to adjust the load impedance of the FET 31 easily to the optimum load impedance for large signal operation during oscillation. By optimizing the load impedance, it is possible to obtain a microwave oscillator having a high output power, or a microwave oscillator of a higher stability, i.e. not stopping oscillation if the load impedance fluctuates greatly. In addition it is not necessary to install a DC blocking circuit because the output terminal 45 and source terminal 34 are isolated in terms of DC by the capacitor 54.

Thus, in the embodiment in FIG. 16, by properly setting the element values of the inductor 36 and capacitors 37, 53, and 54, a highly stable microwave oscillator may be obtained.

Figure 18:
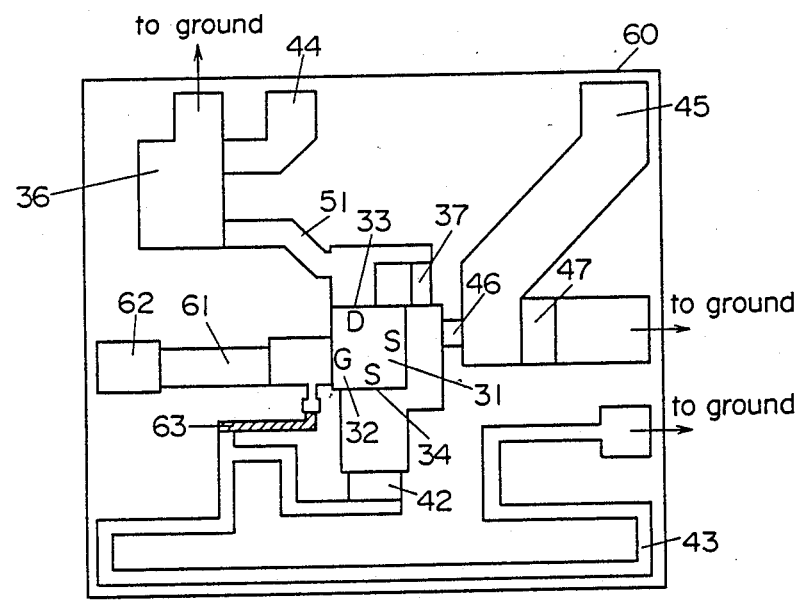
FIG. 18 is a pattern diagram of an MMIC (monolithic microwave integrated circuit) chip of a microwave oscillator in accordance with a seventh embodiment of this invention.
Figure 19:
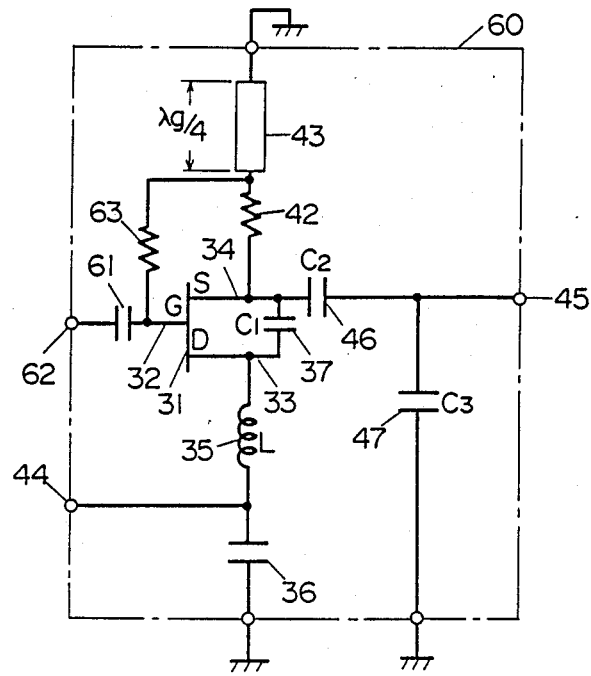
FIG. 19 is an equivalent circuit diagram of the MMIC chip of the microwave oscillator in the shown embodiment in FIG. 18.
Figure 20:
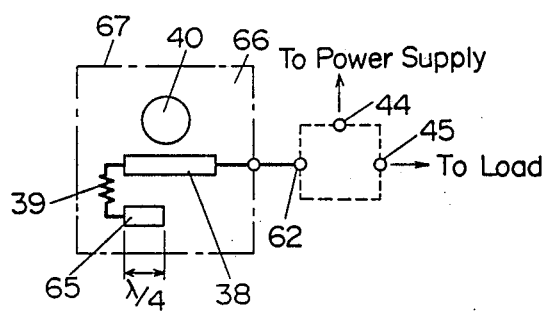
FIG. 20 is a structural drawing of a microwave oscillator using the MMIC of FIG. 18.

FIGS. 18, 19, and 20 refer to a seventh embodiment in accordance with this invention. Specifically, FIG. 18 is a pattern diagram of an MMIC (monolithic microwave integrated circuit) chip. FIG. 19 is an equivalent circuit diagram of the MMIC chip, and FIG. 20 is a structural drawing of a microwave oscillator using this MMIC chip. The elements which are the same as those shown in FIGS. 6, 8, 10, 12, 14, and 16 are identified with the same reference numbers. Incidentally, the microstripline 51 in FIG. 18 corresponds to the inductor 35 in FIG. 19.

As it may be easily understood by comparing FIGS. 19, 20 with FIG. 10 and the circuit configuration in this embodiment is similar to that of the foregoing embodiment, except for three different points: that is, a high value resistor 63 of 5 kΩ is present between a gate terminal 32 and a drain terminal 33, a capacitor 61 having a low impedance at the oscillation frequency is present, and a terminal resistor 39 is grounded at a high frequency by ¼ wavelength microstripline 65. Capacitors 36, 37, 46, 47, and 61 are MIM capacitors. Since the resistor 63 has a high resistance, it does not affect the high frequency signal. Since the capacitor 61 has an extremely low impedance at the oscillation frequency, the resonant circuit connection terminal 62 and the gate terminal 32 may be regarded as being short circuited at the oscillation frequency. Accordingly, the embodiment shown in FIG. 20 presents an oscillator, which in the same fashion as in the embodiment in FIG. 10, can start oscillation securely, and is high in output power, and can maintain oscillation if the impedance of the load fluctuates greatly. In terms of DC, the gate terminal 32 is grounded by way of the high value resistor 63 and ¼ wavelength microstripline 43, and the resonant circuit connection terminal 62 and the gate terminal 32 are isolated. It is hence not necessary to ground the gate terminal in terms of DC within the resonant circuit 67 disposed on a microwave board 66, and the configuration of the resonant circuit 67 is simplified. Incidentally, during large amplitude oscillation the potential of the gate terminal 32 periodically becomes positive as compared with the potential of the source terminal 34. This causes a forward gate current, which may occasionally damage the gate. However, since the resistor 63 has a high resistance of 5 kΩ, it is possible to suppress the forward gate current, so that the deterioration of the MMIC can be prevented.

A GaAs MMIC corresponding to the embodiment in FIG. 19 was experimentally manufactured. The microstripline 51 was designed to have a width of 70 μm and a length of 1000 μm. The capacitor 37 had a value of 0.2 pF; the capacitor 46 had a value of 0.21 pF, and the capacitor 47 was composed of an open-ended microstripline with a characteristic impedance of 50 Ω and a length of 800 μm. The capacitor 61 was designed to have a value of 3.6 pH, and the resistor 63 to have a value of 5 kΩ. Connected to the resonant circuit 67 of 10.75 GHz, the device oscillated at a supply voltage of 5 V. At this time, the output power was 12.4 dBm, and the maximum VSWR of the load to keep the relationship of $|\Gamma_G|>1$ was $>15$. As compared with the MMIC oscillator known so far, the output power was higher by more than 2 dB.

Figure 21:
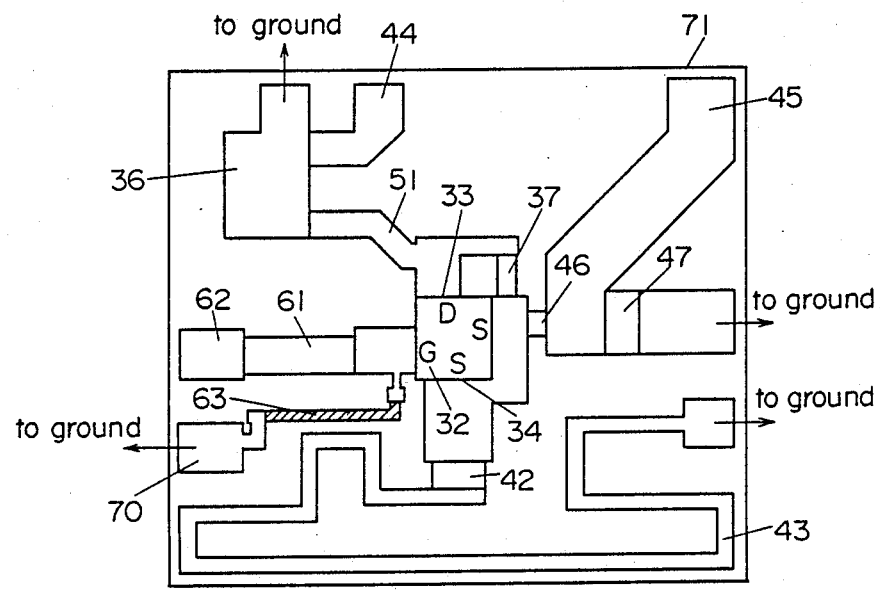
FIG. 21 is a pattern diagram of an MMIC chip of a microwave oscillator in accordance with an eighth embodiment of this invention.

FIG. 21 is an eighth embodiment in accordance with this invention, showing a pattern diagram of an MMIC chip. The elements which are the same as those shown in FIGS. 6, 8, 10, 12, 14, 16, and 18 are identified with the same reference numbers. The configuration is similar to that of FIG. 18, except that one end of the resistor 63 is connected to a bonding pad 70 for grounding. The oscillator shown in FIG. 21 operates exactly the same as the oscillator shown in FIG. 18. oscillator. In the in FIG. 18, the gate terminal 32 and source terminal 34 are connected to each other in terms of DC, by way of the ¼ wavelength microstripline 43 and resistor 63. Therefore, when inspecting the DC characteristics of the FET 31, an electric current also flows into the resistors 42 and 63, and the DC characteristics of the FET 31 cannot be inspected. In FIG. 21, the gate terminal 32 and source terminal 34 are not connected to each other in terms of DC in the MMIC chip 71 alone. Accordingly, the DC characteristics of the FET 31 can be inspected easily at the time of production.

Figure 22:
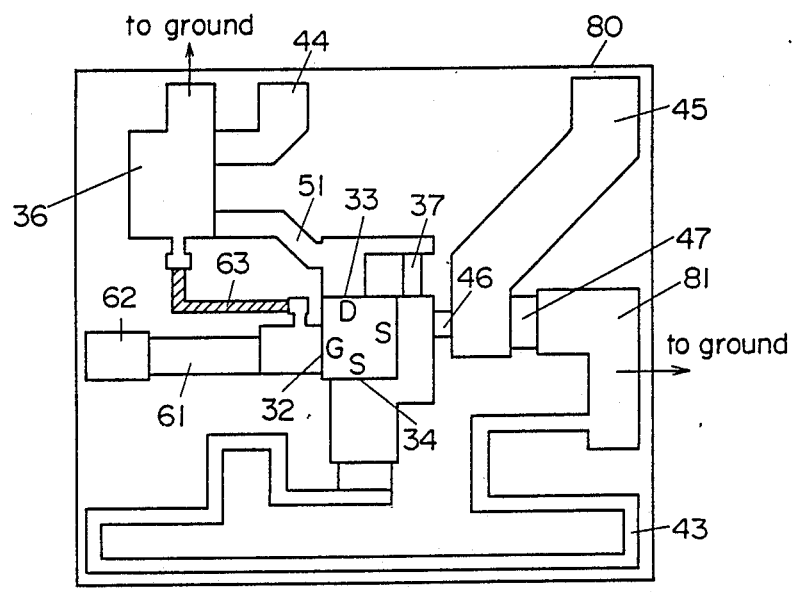
FIG. 22 is a pattern diagram of an MMIC chip of a microwave oscillator in accordance with a ninth embodiment of this invention.
Figure 23:
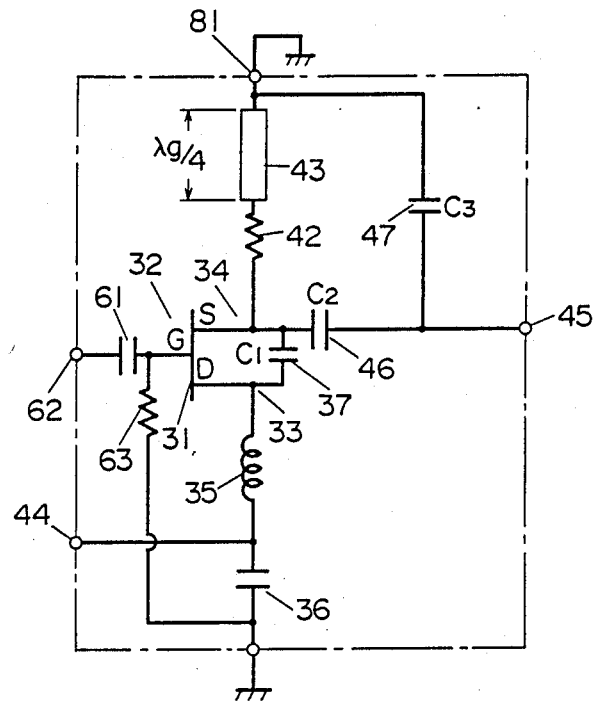
FIG. 23 is an equivalent circuit diagram of the MMIC chip of the microwave oscillator in the embodiment shown in FIG. 22.

FIGS. 22, and 23 refer a ninth embodiment in accordance with this invention; FIG. 22 shows a pattern diagram of an MMIC chip and FIG. 23 shows its equivalent circuit. The elements which are the same as those shown in FIGS. 6, 8, 10, 12, 14, 16, 18, 20, and 21 are identified with the same reference numbers. The configuration shown in FIGS. 22 and 23 is similar to that shown in FIGS. 18 and 21, except that one end of the resistor 63 is connected to the ground side of the bypass capacitor, and that the ground sides of the ¼ wavelength microstripline 43 and capacitor 47 are mutually connected to form a bonding pad 81 for grounding.

The MMIC chip shown in FIG. 22 functions exactly same as that shown in FIG. 18 or FIG. 21. The gate terminal 32 and source terminal 34 of the FET 31 are isolated in terms of DC. Accordingly, in the same fashion as in the embodiment shown in FIG. 21, the DC characteristics of the FET 31 may be easily inspected at the time of production. Still more, as compared with the configuration shown in FIG. 21, the bonding pad for grounding may be reduced in two positions. Hence, the MMIC may be reduced in size, and the manpower needed in the assembling process may be reduced.

Meanwhile, in the embodiments in FIGS. 6, 8, 10, 12, 14, and 16, a chip FET was used, but this is not limitative, and a package FET, bipolar transistor, or other active elements for oscillation having three terminals may be used. Besides, the circuit may be designed as an MMIC either wholly or partly. In FIGS. 6, 8, 10, 12, 14, 16, and 20, a resonant circuit 41 using dielectric resonator 40 was used, but other resonators or resonant circuits may be equally used. In FIGS. 6, 8, 10, 14, 16, 18, 19, 21, 22, and 23, the inductors and capacitors expressed by centralized constants may be also realized by distributed constant circuits such as equivalent stub stripline. In FIG. 12, either one or both of the microstriplines 50 and 51 may be realized by inductors of concentrated constant elements. Similarly, in FIG. 12, the microstripline 49 may be replaced by a capacitive shorted-end stripline or a centralized constant element such as an MIM (metal-insulator-metal) capacitor. In the drawings from FIG. 5 to FIG. 23, needless to say, the optimum values of the inductance and capacitance of the inductor 35 and the capacitors 37, 46, 47, 53, and 54 may be different depending on the characteristics of the FET 31 or the oscillation frequency.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

We claim:

1. A microwave oscillator comprising:
   a three-terminal active element having first, second and third terminals;
   a first inductive element having one end which is grounded at high frequency and having another end which is connected to said first terminal;
   a resonator circuit connected to said second terminal; and
   a first capacitive element having one end which is connected to said first terminal and having another end which is connected to said third terminal, wherein
   an output is taken out from said third terminal.

2. A microwave oscillator according to claim 1, wherein the inductance L of the first inductive element and the capacitance C of the first capacitive element are selected so that the relationship of $$f \approx 1/(2\pi \sqrt{L \cdot C})$$

is established, where f is the oscillation frequency.

3. A microwave oscillator according to claim 1, wherein a FET comprises said three-terminal active element, said first terminal being the drain terminal of said FET and said second terminal being the gate terminal of said FET and said third terminal being the source terminal of said FET.

4. A microwave oscillator according to claim 3, further comprising:
   an output terminal; and
   a second capacitive element having one end which is connected to said source terminal and having another end which is connected to said output terminal.

5. A microwave oscillator according to claim 4, further comprising a third capacitive element having one end which is grounded and having another end which is connected to said output terminal.

6. A microwave oscillator according to claim 3, further comprising:
   an output terminal;
   a series circuit of a second capacitive element and a second inductive element, said series circuit having one end which is connected to said source terminal and having another end which is connected to said output terminal; and
   a third capacitive element having one end which is grounded and having another end which is connected to said output terminal.

7. A microwave oscillator according to claim 3, further comprising a second capacitive element having one end which is grounded and having another end which is connected to said source terminal of said FET, wherein an output is taken out from said source terminal.

8. A microwave oscillator according to claim 7, further comprising:
   an output terminal; and
   a third capacitive element having one end which is connected to said source terminal and having another end which is connected to said output terminal.

9. A microwave oscillator according to claim 3, further comprising:
   a ¼ wavelength microstripline having one end which is grounded, and having a line length of about ¼ of the wavelength of an oscillation signal of the oscillator;
   a low resistance element having one end which is connected to said source terminal and having another end which is connected to another end of said ¼ wavelength microstripline; and
   a high resistance element having one end which is connected to said another end of said ¼ wavelength microstripline and having another end which is connected to said gate terminal.

10. A microwave oscillator according to claim 3, further comprising:
    a ¼ wavelength microstripline having one end which is grounded, and having a line length of about ¼ of the wavelength of an oscillation signal of the oscillator;
    a low resistance element having one end which is connected to said source terminal and having another end which is connected to another end of said ¼ wavelenght microstripline; and
    a high resistance element having one end which is grounded and having another end which is connected to said gate.

11. A microwave oscillator according to claim 9, wherein a DC blocking circuit is disposed between said gate terminal of said FET and said resonant circuit, and wherein said DC blocking circuit and said FET are both mounted on one semiconductor substrate.

12. A microwave oscillator according to claim 1, wherein a bipolar transistor comprises said three-terminal active element, wherein:
    said first terminal is the collector terminal of said bipolar transistor;

said second terminal is the base terminal of said bipolar transistor; and said third terminal is the emitter terminal of said bipolar transistor.

13. A microwave oscillator according to claim 3, further comprising:

a capacitive element having an extremely low reactance at an oscillation signal frequency of the oscillator, said capacitive element having one end which is connected to ground and having another end connected to said one end of said first inductive element; and a high resistance element having one end which is connected to said gate terminal of said FET and having another end which is connected to said one end of said capacitive element;

wherein said capacitive element and said high resistance element and said FET are all disposed on one semiconductor substrate.

14. A microwave oscillator according to claim 13, wherein a DC blocking circuit is disposed between said gate terminal of said FET and said resonator circuit, and wherein said DC blocking circuit and said FET are both mounted on one semiconductor substrate.

* * * * *